United States Patent [19]
Hill

[11] Patent Number: 6,023,336
[45] Date of Patent: Feb. 8, 2000

[54] TECHNIQUE FOR AUTOMATED ALIGNMENT OF SEMICONDUCTOR CHIPS

[75] Inventor: Darrell G. Hill, Plano, Tex.

[73] Assignee: Texas Instruments Incorporated, Dallas, Tex.

[21] Appl. No.: 08/984,223

[22] Filed: Dec. 3, 1997

Related U.S. Application Data

[60] Provisional application No. 60/032,365, Dec. 3, 1996.

[51] Int. Cl.[7] .................................................. G01B 11/00
[52] U.S. Cl. ........................................................... 356/399
[58] Field of Search ................................. 356/375, 179, 356/399, 400, 401

[56] References Cited

U.S. PATENT DOCUMENTS

| | | | |
|---|---|---|---|
| 4,253,079 | 2/1981 | Brosh | 336/84 |
| 4,286,201 | 8/1981 | Roecks et al. | 318/640 |

*Primary Examiner*—Frank G. Font
*Assistant Examiner*—Michael Stafira
*Attorney, Agent, or Firm*—Wade James Brady III; Richard L. Donaldson

[57] ABSTRACT

A method and apparatus for accurate automated alignment of semiconductor chips (12,14) or thin-film networks includes forming a plurality of vias (16–19,22–25) in each integrated circuit element in respective locations, and moving the integrated circuit elements to bring the corresponding vias into alignment. In one embodiment, the integrated circuit elements (12,14) are moved by inserting a plurality of spindles (36–39) into respective vias in the integrated circuit elements to align the integrated circuit elements. In another embodiment, the integrated circuit elements (40,42) are moved by providing a source of light (48) on one side of the integrated circuit elements and a light sensor (50) on another side of the integrated circuit elements, and moving the integrated circuit elements to maximize the amount of light traversing the vias (44,46). To enable precision alignment of the integrated circuit elements, the vias may be formed with diameter less than 50 $\mu$m.

21 Claims, 1 Drawing Sheet

TECHNIQUE FOR AUTOMATED ALIGNMENT OF SEMICONDUCTOR CHIPS

This application claims priority under 35 USC §119(e)(1) of provisional application number 60/032,365 filed Dec. 3, 1996.

BACKGROUND OF THE INVENTION

1. Field of the Invention

This invention relates to improvements in method and apparatus for accurate automated alignment of semiconductor chips, thin-film networks, or the like, in a manufacturing environment.

2. Relevant Background

There is a need for accurate placement of semiconductor chips and/or thin-film networks (TFNs) in semiconductor component manufacturing. Current pick-and-place machines (used extensively in silicon manufacturing) have typical accuracy of no better than 0.5 mil (12.5 $\mu$m), which is generally considered coarse by current integrated circuit standards.

One application in which the need for accurate placement of chips is apparent is in the vertical stacking of chips. In one approach to the fabrication of three-dimensional integrated circuits, completed chips, TFNs, or the like, are stacked on top of each other with vertical interconnections between layers. Precise alignment between different levels in the stack is not easy to achieve or maintain during the stacking process, since each overlying chip obscures the one below it. Relying on the chip edges for alignment is not accurate, since the chip edges are defined by sawing or scribing rather than the more accurate photolithography used for other alignments.

Also, for stacking of multiple layers, there is a need for stabilization of the stack until the alignment is permanently locked in by some process step, such as an epoxy curing step or solder step. Unless alignment of lower levels is somehow maintained during stacking of subsequent levels, an alignment lock-in step is required every time another layer is added to the stack, increasing the time and cost of the assembly.

SUMMARY OF THE INVENTION

In light of the above, therefore, it is an object of the invention to provide a method and apparatus for precisely aligning semiconductor parts, such as integrated circuit elements, or the like.

This and other objects, features and advantages of the invention will be apparent to those skilled in the art from the following detailed description of the invention, when read in conjunction with the accompanying drawings and appended claims.

According to a broad aspect of the invention a technique is presented for accurate automated alignment of semiconductor chips, thin-film networks, or the like, in a manufacturing environment. More particularly, a method is presented for aligning a plurality of integrated circuit elements with each other by forming a plurality of vias in corresponding locations of each integrated circuit element. The integrated circuit elements are in a desired alignment with respect to each other when the vias of each integrated circuit element are in alignment with corresponding vias of another integrated circuit element. The method also includes moving the integrated circuit elements to bring the corresponding vias into alignment. In one embodiment, the integrated circuit elements are moved by inserting a plurality of spindles into respective vias in the integrated circuit elements to align the integrated circuit elements. In another embodiment, the integrated circuit elements are moved by providing a source of light on one side of the integrated circuit elements and a light sensor on another side of the integrated circuit elements, and moving the integrated circuit elements to maximize the amount of light traversing the vias. To enable precision alignment of the integrated circuit elements, the vias may be formed with diameters less than 50 $\mu$m.

According to another broad aspect of the invention, an apparatus embodiment is presented for aligning a plurality of integrated circuit elements having vias therethrough that are aligned when the integrated circuit elements are aligned. The apparatus includes a base with a plurality of spindles thereon. Each of the spindles is located at a location corresponding to a via in the integrated circuit elements when the integrated circuit elements are aligned. The spindles each have an upper tapered portion to engage an interior wall of the via at the corresponding location to guide the integrated circuit elements into alignment. The spindles also may have a portion of substantially constant diameter that is substantially equal to a diameter of the via at the corresponding location. For precision alignment, the vias may have a diameter less than 50 $\mu$m.

According to yet another broad aspect of the invention, another apparatus embodiment is presented for aligning a plurality of integrated circuit elements having vias therethrough that are aligned when the integrated circuit elements are aligned. The apparatus includes a base, a plurality of light sources on one side of the integrated circuit elements, and a corresponding plurality of light detectors, each to receive light from a light source on another side of the integrated circuit elements to produce an output signal relatable to an intensity of light detected thereby. Each of the light sources and the corresponding light detectors are located on an axis of a respective one of the vias when the vias are aligned. Positioning apparatus positions at least one of the integrated circuit elements, and circuitry is provided for controlling the positioning apparatus in response in response to the output signal of the light detector to move the at least one of the integrated circuit elements to a location at which the output signal of the light detector is maximum. The light source may be, for example, a laser, a noncoherent light source, a light emitting diode, or other suitable source. For alignment precision, the vias may have a diameter less than 50 $\mu$m.

BRIEF DESCRIPTION OF THE DRAWINGS

In the various figures of the drawing, like reference numerals are used to denote like or similar parts.

DETAILED DESCRIPTION OF THE PREFERRED EMBODIMENTS

According to a preferred embodiment of the invention a technique is presented for accurate automated alignment of semiconductor chips and/or thin-film networks in a manufacturing environment. In one implementation, vias that are formed through chips to be aligned are used as alignment aids by having a pick-and-place machine thread the chip onto spindles that guide the chip. Pick-and-place machines are well known in the art and are not described further herein. The spindles are tapered so that the accuracy of the pick-and-place machine is sufficient to thread the spindles into the vias initially. As the chip is lowered onto the spindles, the spindle diameter increases and approaches the via diameter, guiding the chip with high accuracy to the desired location. Subsequent chips can be stacked on the same spindles.

When the stacking or assembling is completed, the various integrated circuit elements can be attached, for example, by gluing, reflowing solder, or other technique, the spindles can be removed from the stack, and the stack itself can be handled conventionally as if it were a single chip. This implementation naturally maintains alignment between all the levels until the stack is complete, so that only a single "alignment lock-in step", such as by an epoxy cure or solder flow, is required.

Figure 1:
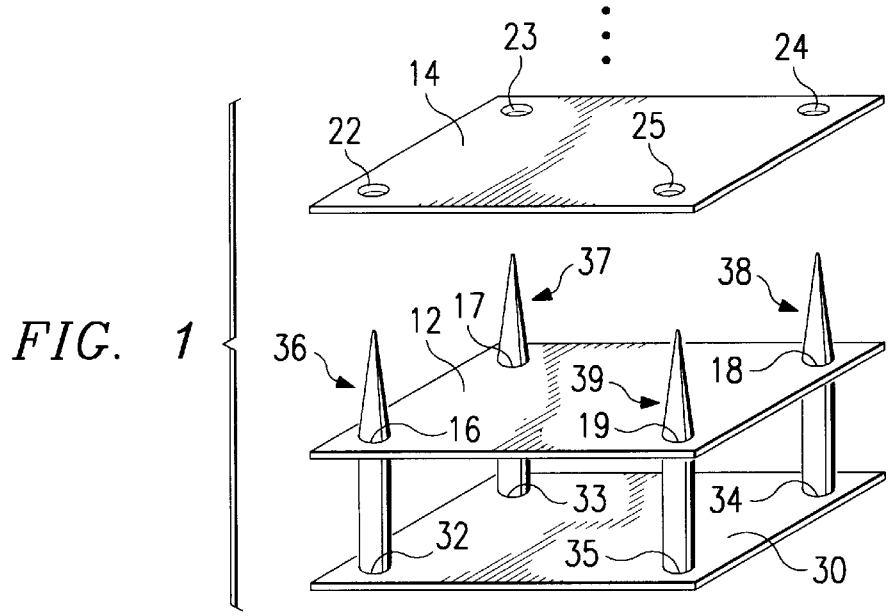
FIG. 1 is an exploded isometric view of integrated circuit chips or plates being aligned via spindles, according to a first preferred embodiment of the invention.

More particularly, a first preferred embodiment of the method of the invention is illustrated in FIG. 1, in which two integrated circuit elements 12 and 14 are placed in vertical alignment. It should be noted that although only two integrated circuit elements are shown, the technique of the invention is equally applicable to any number of integrated circuit elements. In addition, although the integrated circuit elements 12 and 14 are shown in the form of rectangular semiconductor plates, the invention can be practiced with integrated circuit elements of other types, for example, silicon, gallium arsenide, or other semiconductor chips, thin film networks, insulation layers, or the like. The term integrated circuit element is not intended to imply that transistors or other integrated circuit devices need actually be contained on the integrated circuit element, but, rather, that the integrated circuit element is useful in the construction of integrated circuit devices. Typically, such devices may be configured as a wafer or plate, perhaps of 100 $\mu$m thickness.

Additionally, although the integrated circuit elements 12 and 14 are shown as being vertically aligned in FIG. 1, the particular orientation of the alignment may be altered to suit the particular application desired. It should be noted also that although the integrated circuit elements 12 and 14 are shown in the illustration to be substantially identical rectangular elements, they need not be of the same shape or size. For example, it may be desired that one element be mounted in a particular alignment with a smaller or differently shaped element, for example, to bring connection elements or parts of one integrated circuit element into electrical contact with corresponding parts on the other, or for some other purpose.

Each of the integrated circuit elements 12 and 14 has a number of vias or apertures formed therethrough. The vias preferably are formed by lithographically defining the region in the integrated circuit element in which the via is desired to be formed, then removing the material of the integrated circuit element in that region by plasma etching or other suitable technique. It should be noted that since the invention is directed to the alignment of integrated circuit processes, other semiconductor fabrication processing steps may be used, as will be apparent to those skilled in the art.

In the embodiment illustrated, integrated circuit element 12 has four vias 16–19, and integrated circuit element 14 has four corresponding vias 22–25 formed therethrough. Although four vias 22–25 and 16–29 are shown in the embodiment illustrated, it will be appreciated that other numbers of vias may be equally, advantageously employed. For example, two, three, five, or any number of suitable vias can be used, depending upon the alignment accuracy and the convenience that is desired. To enable precision alignment of the integrated circuit elements, the vias may be formed with diameter, for example, of 50 $\mu$m, or less, although vias of other diameters may be suitable, depending upon the desired application. The precision by which the vias 16–19 and 22–24 are located and formed will determine the ultimate precision by which the integrated circuit elements 12 and 14 can be ultimately, mutually aligned.

In order to align the integrated circuit elements 12 and 14, a base plate 30 is provided to support a number of spindles 32–35. Each of the spindles 32–35 has a tapered upper end 36–39 for receiving the respectively stacked integrated circuit elements 12 and 14 in alignment for receiving a respective one of the vias 16–19 and of the vias 22–24. The spindles 32–35 are additionally constructed with a constant cylinder diameter along their lower portions. If desired, the lower portions of the spindles may be formed with a decreasing diameter in the direction of the top portion thereof, although preferably to precisely engage the walls of the vias 16–19 and 22–24, the diameters of the lower portion of the spindles 36–39 may be substantially equal to the diameters of the vias into which they will be inserted. For example, if the vias are formed with a 50 $\mu$m diameter, the diameter of the lower portions of the spindles may be constructed also to have a 50 $\mu$m diameter.

By virtue of the tapered portions 36–39 on the respective spindles 32–35, the contact between the spindles and the walls of the respective apertures 16–19 and 22–25 within which the spindles are received physically moves the integrated circuit plates 12 and 14 to their desired alignment positions with respect to each other, until the lower portions of the spindles are reached. After the integrated circuit elements are stacked with the desired alignment, the elements of the stack may be attached to each other, for example, by epoxy glue, solder, or other means, and removed from the spindles 32–35 as an assembly for subsequent processing.

In a second implementation, the vias are used as final alignment aids by optical means. One or more light source/detector pairs are placed on opposite sides of the stack. Following rough alignment of an upper chip to a lower chip by the pick-and-place machine, the source/detector pair is used to sense light passing through the vias in the two chips. By maximizing the light intensity through the vias with respect to the relative positions of the chips, an automated system can achieve very accurate alignment. Subsequent chips can be aligned and stacked in similar fashion.

Figure 2:
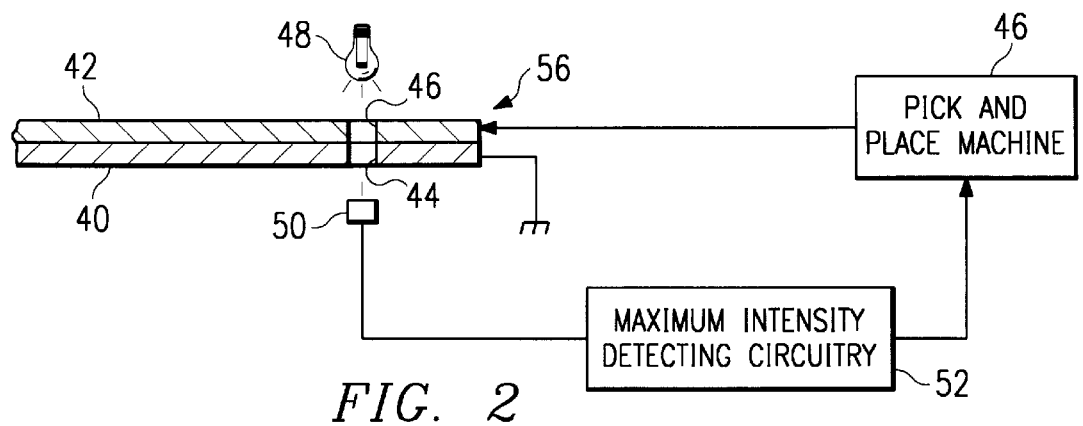
FIG. 2 is a diagrammatic view of a pair of integrated circuit elements using vias and light sensing apparatus to precisely position the integrated circuit elements, in accordance with a second preferred embodiment of the invention.

More particularly, with reference now additionally to FIG. 2, an alternative embodiment of the technique for aligning integrated circuit elements is shown. As shown, a first integrated circuit element 40 is located on an inertial ground, or other structure that will enable relative movement between it and a second integrated circuit element 42. The second integrated circuit element 42 will be positioned over the first integrated circuit element 40, as shown, to be precisely located thereover.

Each of the integrated circuit elements 40 and 42 has a plurality of vias formed therein, via 44 illustrated in FIG. 2 being formed through the lower integrated circuit element 40, and via 46 being formed in the upper integrated circuit element 42. The upper integrated circuit element 42 is positionally located and moved by a pick-and-place machine 46.

In the embodiment illustrated, in order to align the vias 44 and 46 of the integrated circuit elements 40 and 42, a light source 48 is located above the location at which the vias 44 and 46 are to be aligned, and a light sensing element 50 is located therebeneath. A maximum light intensity detecting circuit 52 is connected to the light sensor 50 to provide feedback to the pick-and-place machine 46. The maximum intensity detecting circuitry 52 and pick-and-place 46 machine are operative to move the relative position of the upper integrated circuit element 42 with respect to the lower integrated circuit element 40 until a maximum light intensity is detected by the maximum light intensity detecting circuitry 52.

The light source 48 may be any appropriate light emitting device, such as a laser, a light emitting diode, an incoherent light source. Appropriate lens or light focusing elements (not shown), or other suitable light directing devices may also be provided, although such light focusing is not absolutely required. Also, the particular orientation of the integrated circuit elements and light source and light detector can be any convenient orientation, and should not be understood to be limited to that shown in FIG. 2.

It will be appreciated that although only one light source and light detector 48 and 50 are shown in the illustration of FIG. 2, a number of such light source/detector elements may be located at other locations at which vias in the integrated circuit elements 40 and 42 are located. Furthermore, although the light source and detector in the embodiment shown in FIG. 2 are aligned with an axis of the aligned vias of the integrated circuit elements 40 and 42, it should be understood that the method of the invention enables precise alignment of the integrated circuit elements without a concomitant requirement that the light source and detector be precisely aligned along the axis of the aligned vias, although this may be preferred in most applications. Thus, for instance, a single defused light source may be located above the integrated circuit elements to be aligned with a single detector beneath the integrated circuit elements through the vias of which the light is traverses. Preferably, however, at least plural detectors should be used to shorten the time and integrated circuit element movement to achieve maximum light passage from one side to the other during the alignment of the integrated circuit elements 40 and 42.

Figure 3:
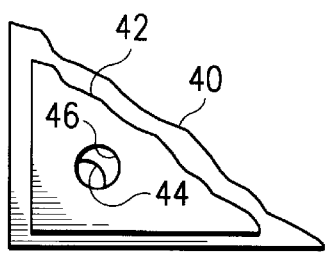
FIG. 3 is a top plan view of a pair of integrated circuit elements in which the upper integrated circuit element is misaligned in upward and rightward directions in the operation of the integrated circuit element alignment apparatus of FIG. 2.
Figure 4:
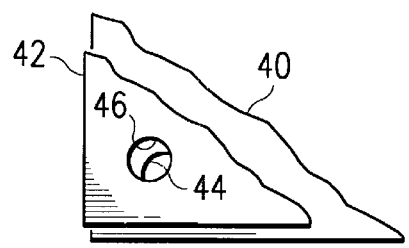
FIG. 4 is a top plan view of a pair of integrated circuit elements in which the upper integrated circuit element is misaligned in upward and leftward directions in the operation of the integrated circuit element alignment apparatus of FIG. 2.
Figure 5:
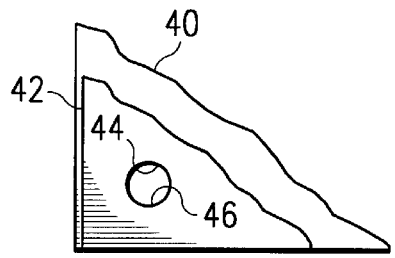
FIG. 5 is a top plan view of the integrated circuit elements of FIG. 2 showing proper alignment of the two integrated circuit elements.

Thus, as shown in FIG. 3, if the upper integrated circuit element 42 is not perfectly aligned with the lower integrated circuit element 40, the area of the aperture defined by the respective vias 44 and 46 and the lower and upper integrated circuit elements will be smaller than if the vias are in perfect alignment, as shown in FIG. 5. Thus, in FIG. 3, in which the upper integrated circuit element 42 is displaced upwardly and to the right, as shown, the total aperture is of decreased area, and, therefore, a decreased amount of light from the light source 48 can pass therethrough. Similarly, as shown in FIG. 4, in which the upper integrated circuit element is displaced upwardly and to the left of the lower integrated circuit element 40, the area of the aperture defined by the vias 44 and 46 is reduced.

Thus, as the integrated circuit elements are moved in one or more axes under control of the pick-and-place machine 46 the amount of light traversing the vias is measured until it is maximized, indicating that the vias are substantially perfectly aligned as shown in FIG. 5. Once the integrated circuit elements 40 and 42 have been moved to the position at which maximum light passing through the various vias in the integrated circuit elements 40 and 42, the elements can be secured to each other, encapsulated, packaged, or other end or intermediate product established.

It should be noted that using the technique of the invention with lithographically defined vias, alignment of accuracy better than five microns, and possibly has high as one or two microns, can be achieved. It should also be noted that the alignment technique is independent of any scribing tolerances or scribing or sawing differences on the edges 56 of the integrated circuit elements 40 and 42.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A method for aligning a plurality of integrated circuit elements with each other, comprising the steps of:

forming a plurality of vias in each integrated circuit element in respective locations, the integrated circuit elements being in a desired alignment with respect to each other when said vias of each integrated circuit element are in alignment with corresponding vias of another integrated circuit element; and moving said integrated circuit elements to bring said corresponding vias into alignment comprising the steps of providing a source of light on one side of said integrated circuit elements and a light sensor on another side of said integrated circuit elements, and moving said integrated circuit elements to maximize the amount of light traversing said vias.

2. The method of claim 1 wherein at least one of said integrated circuit elements is a semiconductor chip.

3. The method of claim 1 wherein at least one of said integrated circuit elements is a silicon chip.

4. The method of claim 1 wherein at least one of said integrated circuit elements is a gallium arsenide chip.

5. The method of claim 1 wherein at least one of said integrated circuit elements is a thin film network.

6. The method of claim 1 wherein said step of forming a plurality of vias is performed by using a semiconductor fabrication process.

7. The method of claim 1 wherein said step of moving said integrated circuit elements to bring said corresponding vias into alignment comprises operating a pick-and-place machine to move the relative positions of said integrated circuit elements.

8. The method of claim 1 wherein said step of forming a plurality of vias comprises forming vias with a diameter less than 50 $\mu$m.

9. The method of claim 8 wherein said step of forming vias with a diameter less than 50 $\mu$m is performed by photolithographic and plasma etching techniques.

10. Apparauts of aligning a plurality of integrated circuit elements having vias therethrough that are aligned when said integrated circuit elements are aligned, comprisings:

first and second integrated circuits, each said integrated circuit having a via extending therethrough of substantially the same cross-sectional dimension, said integrated circuits being disposed so that the axis of the via of one of said integrated circuits passes through the via of the other of said integrated circuits;

a light source for passing light through said vias;

a light detector on to receive said light from said light source to produce an output signal related to the intensity of light detected from said light source; and positioning apparatus for positioning at least one of said integrated circuit elements;

circuitry for controlling said positioning apparatus in response to said output signal of said light detector to move said at least one of said integrated circuit elements to a location at which said output signal of said light detector is maximum.

11. The apparatus of claim 10 further comprising a plurality of said vias extending through each of said integrated circuits and a plurality of light detectors, each light detector receiving light from said light source to produce an output signal related to the intensity of light detected from said light source, each of said light detectors being located on an axis of a respective one of said vias when said vias are aligned, said circuitry further being responsive to the outputs of said plurality of light detectors.

12. The apparatus of claim 10 wherein said integrated circuit elements are planar elements.

13. The apparatus of claim 10 wherein at least one of said integrated circuit elements is a semiconductor chip.

14. The apparatus of claim 10 wherein at least one of said integrated circuit elements is a silicon chip.

15. The apparatus of claim 10 wherein at least one of said integrated circuit elements is a gallium arsenide chip.

16. The apparatus of claim 10 wherein at least one of said integrated circuit elements is a thin film network.

17. The apparatus of claim 10 wherein light source is a laser.

18. The apparatus of claim 10 wherein light source is a non-coherent light source.

19. The apparatus of claim 10 wherein light source is a light emitting diode.

20. The apparatus of claim 10 wherein said vias have a diameter less than 50 $\mu$m.

21. The apparatus of claim 10 wherein said positioning apparatus is a pick and place machine.

* * * * *